(12) United States Patent
Kreft et al.

(10) Patent No.: US 9,343,305 B2
(45) Date of Patent: May 17, 2016

(54) METHOD AND DEVICE FOR CONTINUOUSLY COATING SUBSTRATES

(75) Inventors: Norbert Kreft, Kippenheim (DE); Stefan Oelting, Wachsenburggemeinde (DE)

(73) Assignee: ANTEC SOLAR GMBH, Arnstadt (DE)

( * ) Notice: Subject to any disclaimer, the term of this patent is extended or adjusted under 35 U.S.C. 154(b) by 24 days.

(21) Appl. No.: 13/993,410

(22) PCT Filed: Oct. 28, 2011

(86) PCT No.: PCT/EP2011/069056
§ 371 (c)(1),
(2), (4) Date: Jan. 13, 2014

(87) PCT Pub. No.: WO2012/059439
PCT Pub. Date: May 10, 2012

(65) Prior Publication Data
US 2014/0147992 A1    May 29, 2014

(30) Foreign Application Priority Data

Nov. 1, 2010   (DE) .......................... 10 2010 060 292

(51) Int. Cl.
*H01L 21/20* (2006.01)
*H01L 21/02* (2006.01)
(Continued)

(52) U.S. Cl.
CPC ........ *H01L 21/02631* (2013.01); *C23C 14/243* (2013.01); *C23C 14/246* (2013.01); *C23C 14/566* (2013.01); *H01L 31/1836* (2013.01); *Y02E 10/50* (2013.01)

(58) Field of Classification Search
CPC .................................................. H01L 21/02631
USPC ..................................... 438/478, 486; 117/84
See application file for complete search history.

(56) References Cited

U.S. PATENT DOCUMENTS 3,408,224 A      10/1968  Ashburn et al. ............... 427/250
8,907,210 B2 *  12/2014  Meissner et al. .............. 136/265
(Continued)

FOREIGN PATENT DOCUMENTS

DE       102009009022      8/2010
DE       102010061259      6/2011
(Continued)

OTHER PUBLICATIONS

International Search Report in International Application No. PCT/EP2011/069056 mailed May 10, 2012.
(Continued)

*Primary Examiner* — Julia Slutsker
(74) *Attorney, Agent, or Firm* — Norton Rose Fulbright US LLP

(57) ABSTRACT

The invention relates to a method for the continuous coating of at least one substrate 14 with a semiconductor material e.g. CdTe. To this end a semiconductor material is sublimated in at least one crucible 30 in order to deposit it on a substrate, e.g. a glass panel. If the crucible 30 is filled with semiconductor material (16) during the deposition and/or evaporation, the set-up time required otherwise is then eliminated. Preferably used for carrying out the method is a CSS reactor comprising a crucible, a guide for substrates and at least one lock through which the crucible can be refilled during evaporation of semiconductor material from the crucible.

8 Claims, 1 Drawing Sheet

(51) Int. Cl.
*C23C 14/24* (2006.01)
*C23C 14/56* (2006.01)
*H01L 31/18* (2006.01)

(56) References Cited

U.S. PATENT DOCUMENTS

| | | | |
|---|---|---|---|
| 2004/0035356 A1* | 2/2004 | Zappettini et al. | 117/84 |
| 2006/0236939 A1 | 10/2006 | Powell | 427/248.1 |
| 2010/0154712 A1 | 6/2010 | Tamura | 118/726 |
| 2011/0165326 A1* | 7/2011 | Little et al. | 427/248.1 |

FOREIGN PATENT DOCUMENTS

| | | |
|---|---|---|
| EP | 0337369 | 10/1989 |
| EP | 1903614 | 3/2008 |
| EP | 1970474 | 9/2008 |
| WO | WO/93/23881 | 11/1993 |
| WO | WO/02/24984 | 3/2002 |

OTHER PUBLICATIONS

Written Opinion in International Application No. PCT/EP2011/069056 mailed May 1, 2013.

International Preliminary Report on Patentability in International Application No. PCT/EP2011/069056 mailed May 7, 2013.

* cited by examiner

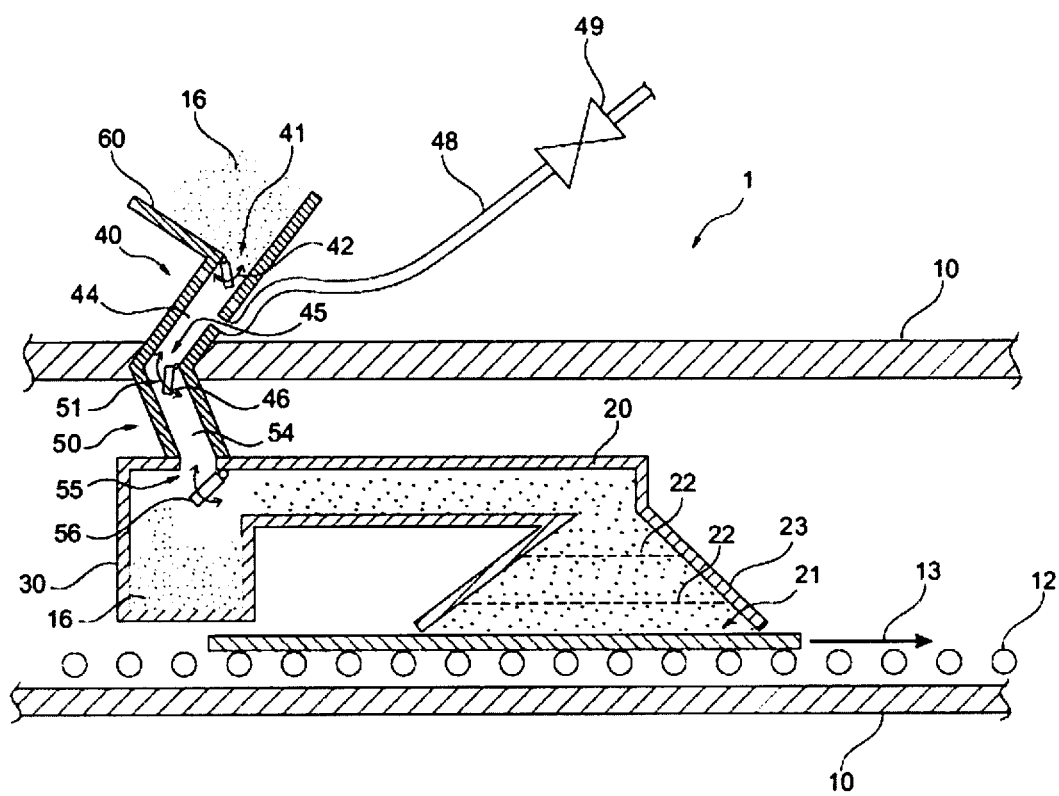

METHOD AND DEVICE FOR CONTINUOUSLY COATING SUBSTRATES

This application is a national phase application under 35 U.S.C. §371 of International Application No. PCT/EP2011/069056 filed Oct. 28, 2011, which claims priority to German Patent Application No. DE 10 2010 060 292 filed on Nov. 1, 2010, both of which are hereby incorporated by reference.

TECHNICAL FIELD

The invention relates to a method according to the preamble of claim 1 and an apparatus suitable for this purpose. According to the method a semiconductor material is evaporated in a crucible and guided to the surface of a substrate to be coated where it is deposited.

PRIOR ART

Methods of the genre specified initially are used to manufacture so-called thin-film solar cells. Here glass panels are coated with semiconductor materials so that an np junction is formed. A corresponding method is known, for example from WO 1993/023881. In this document the so-called "Closed Spaced Sublimation method", also called "CSS method" is described. In the CSS method, semiconductor materials such as, for example, CdTe (cadmium telluride) are sublimated in closed reactors (hereinafter CSS reactors) and deposited onto glass panels. In WO 1993/023881 it is proposed to sublimate the starting material in a plurality of crucibles disposed adjacent to one another above a glass panel so that it is deposited on a glass panel. The advantage of the CSS method is that it avoids expensive clean room technology. In addition, any contamination of the environment with cadmium (Cd) and/or tellurium (Te) is avoided.

In order to produce CdTe solar cells, a substrate which is as transparent as possible, usually a glass panel, is initially coated with a TCO layer which is an electrically conducting transparent oxide layer, e.g. of zinc oxide (ZnO), tin oxide ($SnO_2$), indium oxide ($In_2O_2$), indium tin oxide, also called ITO (mixture of ZnO and $In_2O_3$) or cadmium stannate ($CdSnO_4$). The TCO layer is used for contacting a cadmium sulfide layer (CdS) applied thereto. A CdTe layer is then applied to the CdS layer, to which a further conducting layer is then applied for contacting. Naturally the layers can also be applied in the reverse sequence to a substrate and then covered with a transparent disk, e.g. a glass panel.

The individual layers are usually structured in order to produce a plurality of photovoltaic layers connected in series on a glass panel.

In the Unexamined Laid-Open Patent Application DE 10 2009 009 022, a method for the physical vapour deposition of chalcogens on a substrate is described. To this end the substrate is introduced into a process chamber through a gas lock. The gas lock seals the process chamber against the penetration of oxygen. For coating the substrate a chalcogen vapour—carrier gas mixture is introduced into the process chamber so that the chalcogen vapour condenses on the substrate. To produce the chalcogen vapour, selenium balls are dropped from a reservoir into a metering device which delivers individual selenium balls via a line which can be closed by a ball valve to a heated graphite crucible. The selenium initially liquefies in the graphite crucible before then evaporating. The selenium vapour is guided into the process chamber by nitrogen as carrier gas.

In the Unexamined Laid-Open Patent Application US 2006/023 69 39 A1 a method for coating a substrate with a semiconductor is described. To this end a semiconductor vapour-carrier gas mixture is introduced into a process chamber and directed towards the substrate. To produce the mixture a semiconductor powder is removed from a reservoir and transported with the carrier gas in a pipe system. During transport the semiconductor powder is evaporated by supplying heat.

DE 10 2010 061 259 A1 relates to a CSS method for depositing CdTe. Through locks not described in detail a sublimation crucible is to be topped up with CdTe raw material without interrupting the coating process.

DESCRIPTION OF THE INVENTION

The invention is based on the observation that the CSS reactor must be opened to top up semiconductor material, e.g. CdTe and/or CdS. The production is thereby interrupted, at least the CdTe pressure in the CSS reactor is reduced. In addition, there are a number of further disadvantages: due to the topping up of CdTe in the crucible, the sublimation rate decreases which leads to a nonuniform coating of the substrate. Since the reactor must be opened, toxic substances such as, for example, Cd or Te can enter into the atmosphere. This risk can certainly be reduced by allowing the reactor to cool to approximately ambient temperature before it is opened but this has the disadvantage that the heating phase required subsequently significantly extends the set-up time for topping up, and when restarting production losses of quality must initially be reckoned on since the installation is not yet completely in thermal equilibrium. In addition, in the CSS method the reactor is usually either evacuated or filled with an inert carrier gas. If the reactor is evacuated, it must then be ventilated again before opening. In particular, the evacuation of the reactor required subsequently extends the set-up time. If the reactor is filled with an inert carrier gas during sublimation, this inert atmosphere must be reproduced again after filling the crucible before production can be restarted again.

The invention is based on the object of reducing the quality fluctuations which occur when topping up semiconductor material in a crucible of a CSS reactor.

This object is solved by a method or an apparatus according to the independent claims. Advantageous embodiments of the invention are given in the dependent claims.

The essence of the invention is to top up semiconductor material e.g. CdTe and/or CdS in at least one crucible of a CSS reactor during continuous evaporation and preferably also continuous deposition of semiconductor material onto a substrate. Naturally an initial filling of the crucible can also be accomplished by the method according to the invention.

The method for the continuous coating of at least one substrate has at least the steps of evaporating at least one semiconductor material, e.g. CdTe in at least one crucible and depositing the semiconductor material on the substrate, where the crucible is filled with semiconductor material during the evaporation and/or deposition. The method is preferably carried out in a closed, in particular evacuated reactor, i.e., according to the CSS principle. Preferably before topping up semiconductor material such as CdS and/or CdTe this is preheated with the result that fluctuations of the average temperature of the semiconductor material during topping up and therefore of the sublimation rate are reduced. Particularly preferably the pressure in the CSS reactor and/or the average temperature of the semiconductor material in the crucible is held at least approximately constant. This can be accomplished, for example, by continuous filling of the crucible with semiconductor material, where the average temperature is kept constant by heating the crucible and/or by preheating the semiconductor material to be poured into the crucible.

Preferably the semiconductor material to be topped up e.g. in a lock upstream of a CSS reactor is heated at least approximately (±20%, particularly preferably ±5%) to the temperature of the semiconductor material in the crucible. If the semiconductor to be topped up is introduced into the crucible by means of a lock, the atmosphere in the lock, at least in a lock chamber, is preferably simulated above the crucible or in the CSS reactor. If the coating takes place, e.g. in vacuum, the air or another gas is extracted from the lock and the semiconductor material introduced therein is heated. As a result, the atmosphere of the CSS reactor can be simulated in the lock. Naturally the lock can comprise a plurality of lock chambers in which the steps are carried out consecutively.

The terms material and semiconductor material here designate both the starting material and also the material deposited on the substrate, e.g. a glass panel, where these need not necessarily be identical. The crucible is typically heated. The terms crucible and sublimation crucible are used as synonyms for a vessel suitable for the evaporation of material.

Preferably the semiconductor material for filling the crucible is introduced into at least one first lock chamber. A lock chamber is a closable chamber disposed between at least one closable inlet opening and at least one closable outlet opening. The semiconductor material for filling the crucible can be introduced into a CSS reactor via the lock chamber without the interior of the CSS reactor being connected directly to the environment. To this end, the otherwise closed inlet opening of the lock chamber is initially opened, semiconductor material is introduced through this opening into the lock chamber, the inlet opening of the lock chamber is closed again, the otherwise closed outlet opening of the lock chamber is then opened and the semiconductor material is loaded from the opened outlet opening of the lock chamber from the lock chamber into the reactor.

Particularly preferably the atmosphere in the CSS reactor is simulated after introducing the semiconductor material and before opening the outlet opening, and only then is the outlet opening of the lock chamber opened. This can prevent the atmosphere in the CSS reactor being influenced by gases contained in the lock chamber, i.e. the process in the CSS reactor takes place largely uninfluenced by gases in the lock chamber. To this end, semiconductor material for filling the crucible is introduced into the lock chamber through the inlet opening, with the outlet opening being closed. Then the inlet opening is also closed and the atmosphere of the CSS reactor is simulated. In the event that a negative pressure prevails in the CSS reactor, the lock chamber is evacuated, i.e. a vacuum is produced. Now the outlet opening can be opened and the semiconductor material loaded in the direction of the crucible. Consequently the term vacuum does not stand here for a space theoretically empty of air but for a pressure which is lower than the ambient pressure. Preferably the pressure level in the lock chamber after generating the vacuum at least corresponds approximately (±20% preferably ±5%) to the pressure level in the CSS reactor. In some CSS methods the reactor is not evacuated but is filled with an inert gas, e.g. noble gas or nitrogen ($N_2$). The simulating step preferably comprises introducing inert gas into the lock chamber. Naturally the lock chamber can be evacuated beforehand. In some CSS methods a lower pressure than normal pressure prevails in the CSS reactor, where the residual pressure is at least substantially generated by an inert gas. This atmosphere is preferably also simulated in the lock chamber before the outlet opening of the lock chamber is opened.

Preferably the semiconductor material for refilling the crucible is heated in at least one lock chamber before it is poured into the crucible. By this means temperature fluctuations in the crucible due to topping up the crucible with semiconductor material can be reduced to a minimum and the sublimation process is not or is only insignificantly influenced by the topping up of semiconductor material. As a result, the flow of semiconductor material from the crucible to the substrate remains at least largely constant. Likewise the deposition rate of the semiconductor material on the substrate then also remains at least largely constant. A uniform layer growth on the substrate is the consequence.

Particularly preferably semiconductor material is introduced into the at least one first lock chamber and then an atmosphere is generated in the first lock chamber which at least approximately corresponds in pressure to the atmosphere in the CSS reactor and the further lock chamber disposed between the first lock chamber and the reactor. If the reactor and the further lock chamber are evacuated, the first lock chamber will consequently also be evacuated. Then the semiconductor material is loaded into at least one further lock chamber. In the further lock chamber the loaded semiconductor material is preheated at least approximately (±20%, preferably ±5% or better) to the temperature of the semiconductor material in the crucible. The preheated semiconductor material is then poured into the crucible. As a result, neither the temperature in the crucible nor the atmosphere in the CSS reactor are substantially influenced by the filling of the crucible. The sublimation rate and therefore also the deposition rate of the semiconductor material on the substrate consequently remain at least approximately constant. As a result, the process for deposition of semiconductor material can be carried out continuously without substantial quality fluctuations of the coated substrate occurring. Since the process of producing a negative pressure and heating of the semiconductor material are carried out in separate locks, these processes are necessarily carried out successively. Consequently, no semiconductor material sublimates in the first lock which could escape into the environment when the inlet opening is opened again subsequently.

Particularly preferably before the outlet opening of the further lock is opened, at least approximately (±20%, preferably ±5% or better) the same partial pressure of semiconductor material to be evaporated as in the CSS reactor is produced in the further lock chamber. This can be accomplished in particular by heating the semiconductor material in the further lock under at least substantially similar or identical atmospheric conditions as in the CSS reactor. When opening the lock outlet, the concentration of gaseous semiconductor material in the CSS reactor is therefore only insignificantly adversely influenced—if at all, i.e. the deposition rate of the semiconductor material on the substrate is not significantly influenced by the opening of the outlet opening of the further lock. In particular, in this example it is appropriate if the pressure in the first lock lies between the pressure of the further lock and ambient pressure. Then on opening the outlet opening of the first lock, only a very small amount of gaseous semiconductor material—if any—escapes into the first lock chamber.

This method can be carried out particularly simply if the outlet opening of the first lock chamber is connected to the inlet opening of the further lock chamber and the outlet opening of the further lock chamber is at the same time the inlet opening in the reactor. In particular, the first lock chamber can be disposed above the further lock chamber and the further lock chamber in turn can be disposed above the reactor. Then, it is sufficient to open the corresponding inlet or outlet openings and the semiconductor material slips or falls due to gravity from the first lock into the further lock and from there into the crucible.

Preferably semiconductor material from the first lock chamber is loaded into at least two further lock chambers from which it is poured alternately into the crucible, as a result the supply of semiconductor material into the crucible is more continuous. Fluctuations of the sublimate rate and therefore also the deposition rate of the semiconductor material on the substrate are reduced.

An apparatus for the continuous deposition of a semiconductor material on a substrate according to the CSS method has at least one closed CSS reactor in which at least one crucible for sublimation of semiconductor material is disposed as well as at least one receptacle for at least one substrate which can be disposed on the receptacle in such a manner that previously sublimated semiconductor material is deposited on the substrate. The apparatus additionally comprises at least one first lock having a first lock chamber disposed between at least one inlet opening and at least one outlet opening for holding semiconductor material in readiness and preferably also means for evacuating the lock.

Preferably the apparatus comprises at least one further lock chamber or lock having a further lock chamber disposed between an inlet opening and an outlet opening and means for heating semiconductor material introduced into the further lock. The further lock or lock chamber is preferably disposed between the first lock and the reactor. The pressure in the further lock chamber preferably corresponds at least approximately to the pressure in the interior of the reactor.

If the outlet opening of the first lock is disposed above the inlet opening of the further lock, semiconductor material can then be loaded through the force of gravity from the first lock into the further lock by simply opening the corresponding inlet or outlet openings. The outlet opening of the first lock and the inlet opening of the further lock can be identical. In the arrangement of the outlet or inlet opening, care should merely be taken to ensure that the semiconductor material is loaded through the force of gravity from the one lock into the further lock, e.g. falls or slips when the outlet or inlet opening is opened. For this purpose the outlet opening is disposed accordingly, preferably at the lowest portion of the one lock otherwise the semiconductor material must be actively conveyed to the outlet opening, e.g. by a conveying means such as a shaker conveyor.

If the outlet opening of the further lock is disposed above the crucible, semiconductor material which has previously been loaded to there, then drops and/or slips into the crucible on opening the outlet opening. The outlet opening is accordingly disposed for this purpose preferably at the lowest portion of the further lock. Alternatively the outlet opening of the further lock can be disposed above a storage container from which the semiconductor material is poured in small portions into the crucible. Particularly preferably the semiconductor material is conveyed continuously, e.g. by a corresponding conveying means such as, for example, a shaker conveyor or a screw into the crucible. The more uniformly the crucible is filled with the semiconductor material, the more uniformly the semiconductor material evaporates in the crucible, i.e. the evaporation rate fluctuates, if at all, only within narrow limits. Thus, the deposition of semiconductor material on the substrates is not significantly adversely influenced by the filling of the crucible.

Preferably the semiconductor material is distributed in the crucible. As a result of the distribution of the semiconductor material, the surface of the semiconductor material can be kept at least approximately constant during and/or after each filling of the crucible. As a result, the evaporation rate and therefore also the deposition rate are made more uniform. For distribution of the semiconductor material, the crucible can, for example, be shaken. To this end it preferably has means for shaking.

The crucible is preferably disposed in a CSS reactor above and/or adjacent to the substrate, as a result semiconductor material can easily be topped up from above. At the edge of the crucible, there is preferably attached a channel whose end facing away from the crucible ends above the substrate and is open at the bottom. The channel is preferably disposed jointly with the crucible in a furnace. If the channel is additionally heated, this avoids it clogging over time. Therefore the temperature of the channel wall is preferably higher than the temperature of the semiconductor material in the crucible. According to the prior art, substrates were frequently coated from below. Compared with this prior art, the invention has the advantage that during the described coating of the substrate from above the substrate can be supported on its underside over a large area or at least at closely adjacent points. This prevents sagging of the substrate which is otherwise only supported in the edge region, and the process temperature can be increased which, for example, in CdTe thin film solar modules leads to an improved efficiency.

At least one grid is disposed in the channel, preferably in its end section in order to make the flow rate of the gaseous semiconductor material in the direction of the substrate uniform over the channel cross-section. The grid is preferably heated whereby it can be prevented from becoming clogged with semiconductor material. The temperature of the grid should be higher than the temperature of the material in the crucible. The grid can, for example, be a conductive plate having a plurality of holes.

The CSS reactor preferably has at least one closable opening through which semiconductor material can be poured into the crucible. The closable opening can, for example, be disposed in the wall of the channel or in the crucible wall. Then semiconductor material passed through the opening drops into the crucible, thus filling the crucible.

The closable opening is preferably an outlet opening of a lock and/or a lock arrangement of at least two locks.

Preferably the CSS reactor has means for distributing semiconductor material in the crucible, e.g. means for shaking the crucible. In particular, when topping up with powdery semiconductor material, a cone forms in the crucible. As a result of the cone, the material surface, i.e. the surface of the semiconductor material at which this evaporates is greater than that before filling. The evaporation rate increases accordingly. The rate of deposition of the semiconductor material on the substrate also increases with the evaporation rate. If the semiconductor material in the crucible is now distributed uniformly after topping up, e.g. by shaking the crucible, fluctuations of the material surface and therefore also the deposition rate can be minimized.

DESCRIPTION OF THE DRAWINGS

The invention is described as an example hereinafter by means of exemplary embodiments by reference to the drawing without restricting the inventive idea.

The single FIGURE (FIG. 1) shows a sketch of a CSS reactor for sublimation of semiconductor material, e.g. cadmium telluride (CdTe) and/or cadmium sulfide (CdS) and desublimation of the semiconductor material on a substrate in section.

The CSS reactor 1 is a module of a production line for thin film solar modules. It is suitable for coating substrates 14 such as, for example, glass panels with a semiconductor material such as, for example, CdTe. The CSS reactor 1 has a channel-like housing and can be connected to other modules of the production line on both sides.

In the housing 10 there is a guide on which substrates such as the one indicated by reference numeral 14 can be moved through the CSS reactor 1 (indicated by arrow 13). To this end the guide has a plurality of rollers 12 on which the substrate 14 rests. At least some of the rollers 12 are driven.

For application of the semiconductor material 16 to the substrate, a heated crucible 30 is disposed above the guide in the housing. The crucible goes over smoothly into a likewise heated channel 20 whose open end 21 facing away from the crucible, i.e. the opening 21 thereof facing away from the crucible is disposed as close as possible above the substrate 14. The end section 23 above the substrate is expanded in funnel form. Two grids 22 are disposed in the end section 23.

Above the crucible 30 is an outlet opening 55 of a lock arrangement comprising a first lock 40 and another lock 50. The first lock is at least partially disposed outside the housing. The further lock is preferably disposed at least partially inside the heated housing 10.

The first lock has a lock chamber 44. A negative pressure line 48, which can be shut off, for connection of the lock chamber 44 to a vacuum pump (not shown) opens into the lock chamber 44. At the upper end of the lock chamber 44 is an inlet opening 41 and at the lower end of the lock chamber 44 is an outlet opening 45. The inlet opening 41 can be closed by a closure 42 shown schematically as a flap. When the closure 42 is open, the first lock chamber then communicates with a storage container 60 for semiconductor material 16 disposed on the first lock 40. The outlet opening 45 can also be closed by a closure 46 shown schematically as a flap. When the outlet opening is open, the lock chamber 44 of the first lock 40 then communicates with a further lock chamber 54 of the further lock 50. Accordingly, the further lock 50 has at its upper end an inlet opening 51 which can be closed by the closure 46. At the lower end of the further lock 50 a closable outlet opening 55 is disposed above the crucible 30.

For coating a substrate 14 guided through the housing 10 with a semiconductor material 16, the semiconductor material 16 is evaporated in the crucible 30. Accordingly at least the crucible and the channel are heated. At least the inlet opening 41 of the first lock chamber 44 is closed by the closure 42. Preferably at least the outlet opening 45 of the first lock chamber 44 is closed. The gaseous semiconductor material is distributed in the channel. The gaseous semiconductor material 16 passes out from the channel 20 through the opening 21 of the funnel-shaped end section 23 of the channel 20 facing away from the crucible 30, and impinges upon the substrate 14 located as close as possible to the opening 21. The semiconductor material 16 is deposited on the substrate 14, i.e. it is DE sublimated through the choice of temperature of the substrate.

The grids 22 are used to make the flow rate of the gaseous semiconductor material 16 uniform over the channel cross-section. As a result, the semiconductor material is deposited more uniformly on the substrate than without grids 22. The grids are heated so that as little semiconductor material as possible accumulates on them which would result in clogging of the grids 22. The heating can be accomplished both indirectly and directly, e.g. by passing a current through the grids 22. Other than is shown, the grids are preferably convexly curved. As a result, the flow rate of the semiconductor material is largely homogeneous even in the expanded end section 23.

The funnel-shaped expansion of the end section 23 has the advantage that the semiconductor material is deposited locally relatively slowly, i.e. at a low growth rate. This improves the efficiency of the subsequent thin-film solar modules. At the same time however, deposition takes place over a large area so that the necessary layer thickness of the semiconductor layer is nevertheless achieved very rapidly, i.e. the clock speed of the production line is increased.

When coating the substrate 14 with semiconductor material 16, the supply in the crucible 30 is used up. In order to top up the supply again, the outlet opening 45 of the first lock chamber 40 is closed and the inlet opening 41 of the first lock chamber 40 is opened. Now semiconductor material 16 held in the storage container enters into the first lock chamber. After a desired quantity of semiconductor material 16 has been poured into the first lock chamber 40, the inlet opening 41 is closed again. The first lock chamber 44 is then evacuated via the negative pressure line 48. At the latest the outlet opening 55 of the further lock chamber 54 is now closed and then the inlet opening 51 of the further lock 50 is opened and the outlet opening 41 of the first lock 40 is opened. As a result the semiconductor material 16 is loaded into the further lock chamber. If necessary, both lock chambers 44, 54 could be ventilated via the negative pressure line 48. The inlet opening 41 of the further lock 40 is closed again and the semiconductor material 16 in the further lock chamber is heated to a temperature which at least approximately corresponds to the temperature of the semiconductor material in the crucible. As soon as the desired temperature was reached, the outlet opening 55 of the further lock 50 can be opened, with the result that the semiconductor material 16 is poured into the crucible 30 from the further lock 50.

Whilst the semiconductor material 16 in the further lock 50 is heated, semiconductor material 16 can again be introduced into the first lock 40 and then a vacuum can again be generated in the first lock 40. As a result, new semiconductor material 16 can be loaded from the first lock 40 into the further lock 50 immediately after filling the crucible 30 from the further lock 50 and the subsequent closure of the outlet opening 55 of the further lock 50. This enables a higher timing when filling the crucible 30. Accordingly for the same total quantity of semiconductor material 16 which is topped up in the crucible 30, the individual quantities which are poured into the crucible 30 at each opening of the outlet opening 55 of the further lock 50 are reduced, with the result that the evaporation rate in the crucible 30 is less adversely affected.

As a result of the lock arrangement comprising at least one first lock 40 and at least one further lock 50, the crucible 30 can be topped up with semiconductor material whilst deposition continues. The standstill of the production line required according to the prior art for topping up semiconductor material can thus be omitted.

REFERENCE LIST

1 CSS reactor
10 Housing
12 Roller (driven)
13 Feed direction
16 CdTe
20 Channel
21 Opening of channel 20 facing away from crucible
22 Grid
23 End section of channel 20 facing away from crucible
30 Crucible
40 First lock
41 Inlet opening 42 Closure for closing inlet opening of first lock
44 Lock chamber of first lock
45 Outlet opening
46 Closure for closing inlet opening of first lock
48 Negative pressure line
49 Valve
50 Further lock
51 Inlet opening
54 Lock chamber of further lock
55 Outlet opening of further lock
56 Closure for closing outlet opening of further lock
60 Storage container

The invention claimed is:

1. Method for continuous coating of at least one substrate comprising at least the steps of:
   evaporating a semiconductor material in a crucible at a first temperature; and
   depositing the semiconductor material on the at least one substrate,
characterized in that
the crucible is filled with semiconductor material during the depositing, the evaporating, or both the depositing and the evaporating; and
the semiconductor material is preheated such that, as it enters the crucible, the semiconductor material is at a second temperature that is within 20% of the first temperature.

2. The method according to claim 1,
characterized in that
the semiconductor material for filling the crucible is introduced into at least one first lock chamber.

3. The method according to claim 2,
characterized in that
after introducing the semiconductor material a vacuum is produced in the at least one first lock chamber.

4. The method according to claim 2,
characterized in that
the semiconductor material for filling the crucible is heated in at least one lock chamber before the crucible is filled therewith.

5. The method according to claim 3,
characterized in that
the semiconductor material for filling the crucible is heated in at least one lock chamber before the crucible is filled therewith.

6. Method for continuous coating of at least one substrate comprising at least the steps
   evaporating a semiconductor material in a crucible and
   depositing the semiconductor material on the at least one substrate,
   characterized in that
   the crucible is filled with semiconductor material during the depositing, the evaporating, or both the depositing and the evaporating;
   the semiconductor material is preheated before the crucible is filled therewith;
   the semiconductor material for filling the crucible is introduced into at least one first lock chamber;
   the semiconductor material is introduced into the at least one first lock chamber and then a vacuum is produced in the at least one first lock chamber,
   the semiconductor material is then loaded into at least one further lock chamber,
   the semiconductor material is then heated in the at least one further lock chamber, and
   the crucible is filled with the semiconductor material after heating in the at least one further lock chamber.

7. The method according to claim 6,
characterized in that
the semiconductor material is loaded from the at least one first lock chamber into at least two further lock chambers from which it is alternately poured into the crucible.

8. Method for continuous coating of at least one substrate comprising at least the steps
   evaporating a semiconductor material in a crucible and
   depositing the semiconductor material on the at least one substrate,
   characterized in that
   the crucible is filled with semiconductor material during the depositing, the evaporating, or both the depositing and the evaporating;
   the semiconductor material is preheated before the crucible is filled therewith;
   the semiconductor material for filling the crucible is introduced into at least one first lock chamber;
   the semiconductor material for filling the crucible is heated in at least one lock chamber before the crucible is filled therewith;
   the semiconductor material is introduced into the at least one first lock chamber and then a vacuum is produced in the at least one first lock chamber,
   the semiconductor material is then loaded into at least one further lock chamber,
   the semiconductor material is then heated in the at least one further lock chamber, and
   the crucible is filled with the semiconductor material after heating in the at least one further lock chamber.

* * * * *